United States Patent [19]

Schaefer

[11] Patent Number: 4,519,130
[45] Date of Patent: May 28, 1985

[54] TOOL FOR REMOVING AN ELECTRONIC SLIDE-IN UNIT FROM A FIXING RACK

[76] Inventor: Lothar F. Schaefer, Hummelbaum 22, D 7263 Renningen, Fed. Rep. of Germany

[21] Appl. No.: 462,940

[22] Filed: Feb. 1, 1983

[30] Foreign Application Priority Data

Jan. 2, 1982 [DE] Fed. Rep. of Germany ... 8202450[U]

[51] Int. Cl.³ ..................... H05K 13/04; H05K 3/36
[52] U.S. Cl. ..................... 29/764; 29/239; 29/267; 29/758
[58] Field of Search ............ 29/764, 758, 267, 239; 294/15

[56] References Cited

U.S. PATENT DOCUMENTS

| | | | |
|---|---|---|---|
| 2,094,779 | 10/1937 | Donaldson | 29/267 |
| 3,977,749 | 8/1976 | Langenbach | 339/75 M |
| 4,223,431 | 9/1980 | Skeels | 29/267 |
| 4,223,934 | 9/1980 | Cauceglia et al. | 294/15 |
| 4,307,510 | 12/1981 | Sawyer et al. | 29/764 |

FOREIGN PATENT DOCUMENTS 2812631 10/1978 Fed. Rep. of Germany .
2382174 9/1978 France .

OTHER PUBLICATIONS

IBM Tech. Discl. Bulletin; vol. 24, No. 2, Jul. 1981; p. 1068.

Primary Examiner—Carl E. Hall
Attorney, Agent, or Firm—Fred Philpitt

[57] ABSTRACT

A tool for extracting an electronic slide-in unit from a fixing rack comprises a handle (50) the free end of which carries an elliptic cam member (48). The latter is adapted to be inserted between a front plate (38) of the slide-in unit (16) and a rail (24) of the rack and is dimensioned such that pivoting of the tool causes the front plate (38) to move away from the rack by a distance sufficient to completely overcome the clamping forces of connectors provided on the rack and the slide-in unit, respectively.

16 Claims, 5 Drawing Figures

TOOL FOR REMOVING AN ELECTRONIC SLIDE-IN UNIT FROM A FIXING RACK

The invention relates to a tool for removing an electronic slide-in unit from a fixing rack.

Known extracting tools of this kind have a stirrup-shaped extracting section with an open slot, in which the lower end of the front panel of an electronic slide-in unit sits. A separate, likewise stirrup-shaped supporting part is supported on the fixing rack in the operating position and supports a threaded spindle which, for its part, carries the extracting section. The rotation of the threaded spindle allows the electronic slide-in unit to be removed from the fixing rack.

Such known extracting tools are fixedly installed in the fixing rack. They can therefore of necessity only be arranged at points where no unit locks are provided, which locks are used for pressing the electronic slide-in unit into the fixing rack. As a rule, the known extracting tools are therefore arranged near the centre of the front panel of the electronic slide-in unit.

The establishment of electrical connections to the electronic slide-in unit is effected via a multi-way plug-and-socket connector, which comprise up to a hundred individual plug-and-socket connectors and more on the electronic slide-in units which are in use these days for aeroplanes. In order to ensure that a reliable electric contact is brought about, a good frictional grip between the individual sockets and the individual plugs is necessary. This results in the total force required for closing and opening a plug-and-socket connector reaching the order of magnitude of 500N. When forces of a corresponding magnitude are exerted for the removal of the slide-in unit, there may come about a deformation of the slide-in unit front panel if the known extracting tool is used, since the entire force is introduced at a single point which, over and above this, is near the centre of the front panel so that the front panel can offer relatively little resistance to the corresponding load.

Another disadvantage of the known extracting tools is the fact that they constantly stay on the fixing rack, which is disadvantageous both with respect to the equipment costs and with respect to a smooth-surface area of contact of the assembly formed by the fixing rack and the electronic slide-in units.

It is therefore the object of the present invention to indicate a tool for removing an electronic slide-in unit which is only applied for extracting the electronic slide-in unit and allows the electronic slide-in unit to be released gently and easily.

The extracting tool according to the invention can be easily introduced at a desired point from the bottom into a gap which, with the slide-in unit inserted, extends between the rear of the lower front panel end and the front of a cross member of the fixing rack. The pivoting of the operating lever causes the cam element to press the slide-in unit front panel away from the rack cross member. Since the tool according to the invention is only used for extracting an electronic slide-in unit, it can be applied, after the unit locks have been released, to exactly the same points of the front panel in which the unit locks engage. One can use respectively exactly the same number of extracting tools as the number of unit locks provided (two as a rule). This results in the mechanical stress on the slide-in unit during the removal being symmetrical with respect to the mechanical stress thereon during the insertion. If two extracting tools are used for extracting a slide-in unit retained by two unit locks, then the pivoting movements of the two operating levers can be easily synchronised by the mechanic, so that the slide-in unit is not canted in the associated rack receptacle. If more than two extracting tools are used, then the movements thereof can be easily mechanically coupled, for example by means of a strip provided with blind bores, in which the operating ends of the operating levers sit articulatedly.

In a practical constructional form, an extracting tool according to the invention has a slender shape and can be easily handled, similar to a small-size screw driver, and carried. The production costs of an extracting tool according to the invention are only a fraction of the costs of the known threaded-spindle extracting tools which, over and above this, have to be acquired in a considerably larger number.

Advantageous further developments of the invention are set forth below.

Forming the cam element with a plane end face is of advantage with respect to the attainment of active surfaces of the extracting section and of the supporting section of the tool which are as large as possible.

Ellipse-shaped cross sections of the cam element, are of advantage, on the one hand, with respect to an easy production of the cam elements, since the ellipse cross section can be produced by circular segments which are easily produceable by machine. In addition, if an ellipse-shaped cross section is chosen for the cam elements, there is obtained a high mechanical stepping-down during the removal of an electronic slide-in unit. There is also obtained altogether a high extraction force for releasing the multi-way plug-and-socket connector provided on the rear of the slide-in unit.

Orienting the ellipse such that the minor axis thereof forms with the axis of the operating lever an angle of 15 to 20 degrees, is particularly advantageous with respect to the easy handling of a pair of tools with both hands.

The extracting section of the cam element may be provided with sharp-edged serrations extending in the circumferential direction of the cam element. This ensures that the front panel of the electronic slide-in unit cannot move upwardly while it is extracted. Such a movement of deflection can otherwise occur, caused by that torque which the extraction force produced by the cam element exerts relative to an axis extending parallel to the extraction plane and to the slide-in unit front panel through the multi-way connector. For the multi-way connector is as a rule provided on the rear of the slide-in unit at a distance from the lower and thereof.

Instead of macroscopic ridges, the extracting section may be provided for the same purpose with a coating which has an anisotropic coefficient of friction. Such coatings are known 'per se' and comprise orientated fibres.

A tool, the operating lever of which has a bearing section which projects from the cam element, can be easily inserted, with its bearing section, between two legs of a bearing bracket for a unit lock and one thus obtains in a simple manner a forced positioning of the free end of the operating lever in a direction that is parallel to the lower edge of the slide-in unit front panel as well as a support of the free end of the operating lever in a direction that is vertical to the extraction plane.

The operating lever may further taper towards the free end thereof. This ensures that the free end of the operating lever can be easily inserted between a unit lock threaded spindle, which is only slightly tilted away from the slide-in unit, and the underside of the slide-in unit front panel.

Forming the operating lever with an end section of rectangular cross-section the long side of the rectangle being perpendicular to the axis of the cam element is of advantage with respect to a particularly easy application of the tool and with respect to an easy alignment of the cam element axis vertically to the extraction plane.

If the end section of the operating lever which is adjacent to the cam element is formed with a bend and the cam element is arranged on the side of the bent end section which is directed towards the axis of the operating lever, this is of advantage with respect to an application of the tool to a slide-in unit with the unit lock only slightly swung away.

If the cam element is attached to the operating lever by means of soldering, welding or gluing, it is possible to produce extracting tools provided with cam elements of different shape by using a standard operating lever.

For ergometric reasons, it is advantageous if, with the tool applied and the slide-in unit not yet released, a gripping section of the operating lever extends so as to be obliquely inclined towards the front panel of the slide-in unit. If a handle is superimposed on the operating end of the operating lever in a form-locked manner via a receptable which is inclined towards the handle axis, the cross-section of the operating end of the operating lever and the receptable having at least a two-fold symmetry relative to their axis, this will allow the taking of varying space conditions into account being provided for the respective use by transposing the handle on the operating end of the operating lever. The higher the symmetry of the lever end and the receptacle, the finer the alignment of the handle axis to the operating lever or cam element can be set.

Hereinafter, the invention will be explained in more detail with the aid of some exemplified embodiments and with reference to the accompanying drawings, in which.

Figure 1:
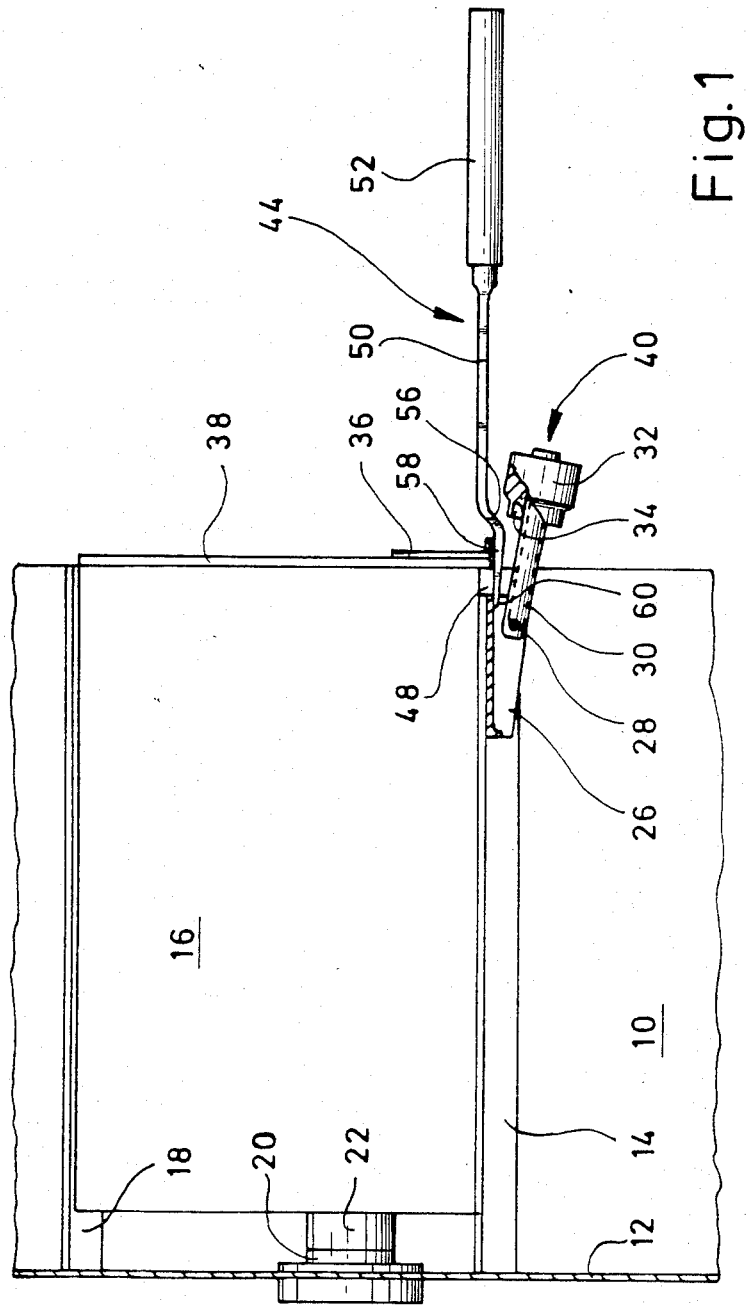
FIG. 1 shows a vertical section through a portion of a rack for electronic slide-in units, there being shown an electronic slide-in unit, an associated unit lock (in the released state) and a tool for extracting the electronic slide-in unit (prior to the initiation of the extraction movement)

FIG. 1 shows a cut-away portion of a rack for the reception of electronic slide-in units and provided with lateral rack walls 10 and a rear rack wall 12. The lateral rack walls 10 carry horizontal L straps 14, on which an electronic slide-in unit 16 is displaceably seated. The rack receptacle associated with the electronic slide-in unit 16 is bounded at the top by further L straps 18.

For the establishment of the necessary electrical connections between the electronic slide-in unit 16 as well as other slide-in units, detecting elements and consumers, there is provided a multi-way connector which comprises a connector part 20, which is fastened in the rear rack wall 12, and a complementary connector part 22 which is carried by the rear wall of the electronic slide-in unit 16.

Figure 2:
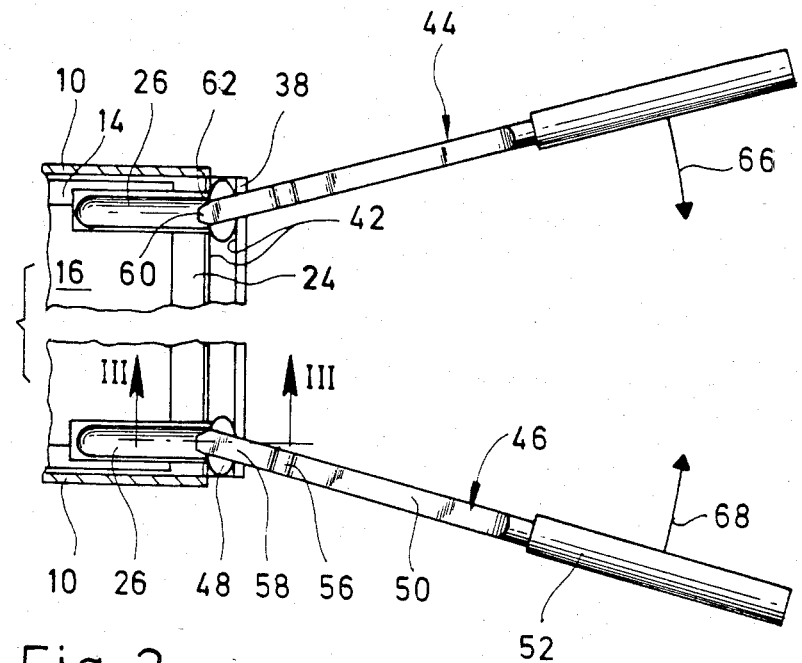
FIG. 2 shows a top view of the arrangement shown in FIG. 1 from the bottom, the unit locks having been omitted for the sake of clarity.

At the lower front end of the slide-in unit receptacle the rack has another L strap 24 which connects the L straps 14 (see FIG. 2).

At the lateral ends of the slide-in unit receptacle there are provided bearing brackets 26, to which one end of a threaded bolt 30 is respectively hinged via a pin 28. On the threaded bolt 30, there runs a clamping nut 32 with a conical recess 34 at the slide-in unit end, which nut engages, for clamping the electronic slide-in unit 16, in the angled end section of a tenterhook 36 which is fastened to a front panel 38 of the electronic slide-in unit 16. The threaded bolt 30 and the clamping nut 32 together form a unit lock 40 which, in FIG. 1, is shown in the state in which it is released and has been swung downwardly away from the front panel 38.

Between the rear of the front panel 38 and the downwardly extending leg of the L strap 24 there lies an interspace 42 (see, in particular, FIG. 2).

FIGS. 1 and 2 show extracting tools 44, 46 for extracting the electronic slide-in unit 16 from its receptacle while overcoming the frictional resistance of the connector parts 20, 22. The extracting tools 44, 46 each have a cam element 48 with an elliptical cross section. The minor axis thereof corresponds to the width of the interspace 42. The length of the major axis of the cam element cross-sectional area is co-ordinated with the plug-in path of the connector parts 20, 22.

The cam elements 48 are fixedly attached, for example fastened with the aid of hard solder, near the free ends of operating levers 50 in such a way that the axis of the cam elements 48 is perpendicular to the axis of the operating levers 50. The second end of the operating levers 50 carries a plastics material handle 52. The operating lever 50 is rectangular in cross section in its part that is remote from the handle, the long side of the rectangle extending parallel to the plane top 54 of the cam elements. The operating lever 50 has a bend 56, which extends downwardly in FIG. 1, so that the unit lock 40 does not have to be swung away far for the application of the extracting tool. The operating lever 50 end section 58 upstream of the bend 56 is tapered, the outermost part of the end section 58 having been taken beyond the cam element 48, as shown at 60. This lever section serves for pivotally locating in position an operating lever 50 between the vertically downwardly extending lateral legs of a bearing bracket 26. The bearing section 60 of the operating levers 50 thus has a width that is associated with the spacing of the bearing bracket legs and is provided with lateral chamfers 62 or curvatures.

Figure 3:
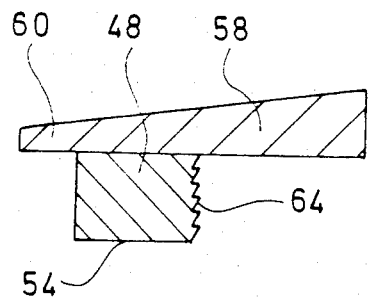
FIG. 3 shows a section through a cam element of an extracting tool along the line III—III of FIG. 2, on an enlarged scale.

As FIG. 3 shows, the handle-end half of the surface of the cam elements 48 is provided with serrations 64 which gently rise in the direction from the top 54 of the cam elements 48 towards the operating lever 50 and are sharply offset.

For releasing an electronic slide-in unit 16, the extracting tools 44, 46 are introduced with their bearing sections 60 into the bearing brackets 26, after the unit locks 40 have been released, as shown in FIGS. 1 and 2, and are so rotated that the cam elements 48 sit in the interspace 42. Pivoting of the operating levers 50 in the sense of the arrows 66, 68 causes the cam elements 48 to be rotated about their axes and during this process these press the front panel 38 away from the L strap 24 with considerable force. Although a torque (in the clockwise sense in FIG. 1) is exerted by this extraction force, the electronic slide-in unit 16 cannot be canted in its receptacle since it is retained by the serrations 64 and the bearing section 60 of the extracting tools 44, 46 is vertically supported on the associated bearing bracket 26. The electronic slide-in unit 16 can thus be easily released while being subjected to a symmetrical mechanical stress.

Figure 4:
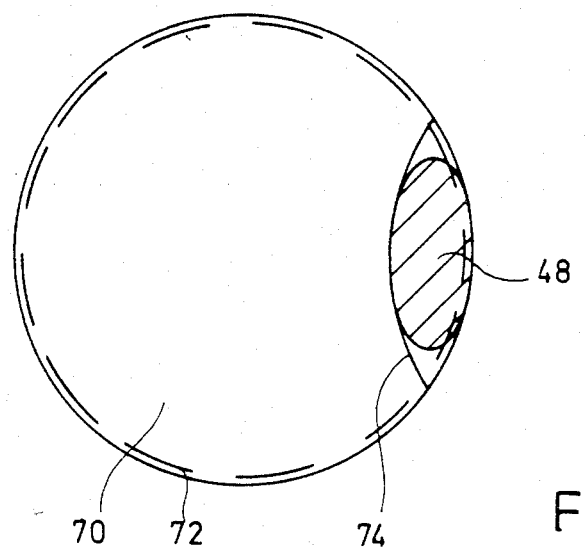
FIG. 4 shows a top view of a turned part, from which cam elements provided with ridges can be produced.

FIG. 4 shows an axial top view of a turned part 70 which is provided with serrations 72 in its outer surface. By sawing along a circular line 74 having the same radius as the turned part 70 it is possible to produce from the latter several lenticular blanks, from which one then obtains a cam element 48 set off by hatching by rounding off the tips. In this way one can very simply produce cam elements 48 provided with very sharp serrations 64.

Figure 5:
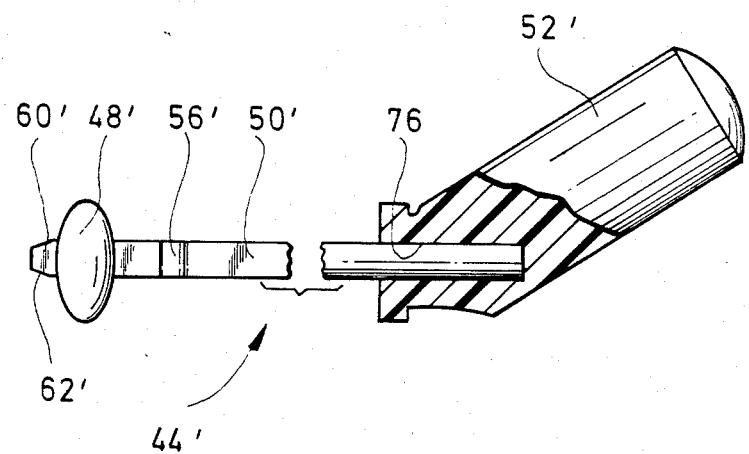
FIG. 5 shows a top view of a modified extracting tool with a transposable handle, partly in section.

FIG. 5 shows a modified extracting tool 44', where a cam element 48' has been so superimposed on an operating lever 50' that the major axis of the ellipse is perpendicular to the axis of the lever. The unit formed by the cam element 48' and the operating lever 50' has thus not yet been adapted to handling by the right hand or the left hand of a mechanic. This adaptation is effected by using a plastics material handle 52' which has a flat rectangular receptacle 76 for the operating lever 50' operating end which also has a flat rectangular cross section. By changing over the plastics material handle 52' one can thus easily convert an extracting tool intended to be worked with the right hand into such a tool which is to be handled with the left hand.

If one uses instead an operating lever end section with a square cross section and a receptacle 76 with a square cross section, then one can superimpose the plastics material handle 52' on the operating lever 50' in four different positions, for example extending upwardly in FIG. 1, too. This allows electronic slide-in units which are arranged near the ground to be released in a very easy and convenient manner.

I claim:

1. A tool for removing an electronic slide-in unit from a fixing rack, comprising an extracting section which engages in a front panel of the slide-in unit, a supporting section which engages in a rack and means for producing a relative movement between the extracting section and the supporting section, characterized in that the extracting section and the supporting section are formed by opposing surface sections of a rigid cam element (48) which is fixedly carried by the free end of an operating lever (5) so that the cam element axis is substantially perpendicular to the axis of the operating lever (5) the opposing surface sections of said cam element thus (being adapted to engaging) a member 24 forming part of the fixing rack and an opposing end portion of the front panel 38 of the slide-in unit 16, respectively, said member 24 of the fixing rack and said end portion of the front panel 38 defining an interspace 42 therebetween.

2. A tool as claimed in claim 1, characterized in that the cam element (48) has a plane end face (54).

3. A tool as claimed in claim 1, characterised in that the cam element (48) has an ellipse-shaped transversal cross section and the major axis of the ellipse forms with the axis of the operating lever (50) an angle which is larger than that formed by the minor axis of the ellipse.

4. A tool as claimed in claim 3, characterised in that the minor axis of the ellipse forms with the axis of the operating lever (50) an angle of 15 to 20 degrees.

5. A tool as claimed in claim 1, characterised in that the extracting section of the cam element (48) is provided with sharp-edged serrations (64) extending in the circumferential direction.

6. A tool as claimed in claim 5, characterised in that the serrations (64) are sharply offset at their ends which are directed towards the operating lever (50).

7. A tool as claimed in claim 1, characterised in that the extending section carries a coating which has a large coefficient of friction parallel to the cam element axis and has a small coefficient of friction in the circumferential direction of the cam element (48).

8. A tool as claimed in claim 1, characterised in that the operating lever (50) has a bearing section (60) which projects from the cam element (48).

9. A tool as claimed in claim 1, characterised in that the operating lever (50) tapers towards the free end (58).

10. A tool as claimed in claim 1, characterized in that at least one end section (58) of the operating lever (50) which is adjacent to the cam element (48) has a rectangular cross section, the long side of the rectangle being oriented in a direction perpendicular to the cam element axis.

11. A tool as claimed in claim 1, characterised in that an end section (58) of the operating lever (50) which is adjacent to the cam element (48) has a bend (56), and in that the cam element (48) is arranged on the side of the bent end section (58) which is directed towards the axis of the operating lever (50).

12. A tool as claimed in claim 1, characterised in that the cam element (48) is attached to the operating lever (50) by means of soldering, welding or gluing.

13. A tool as claimed in claim 1, characterised in that a handle (52') is superimposed on the operating end of the operating lever (50') in a formlocked manner via a receptacle (76) which is inclined towards the handle axis, the cross section of the operating end of the operating lever (50') and the receptacle (76') having at least a two-fold symmetry relative to their axis.

14. A tool for removing an electronic slide-in unit from a fixing rack, comprising an extracting section which engages in a front panel of the slide-in unit, a supporting section which engages in the rack, and means for producing a relative movement between the extracting section and the supporting section, characterized in that the extracting section and the supporting section are formed by opposing surface sections of a rigid cam element (48) which is fixedly carried by the free end of an operating lever (50) so that the cam element (48) which is fixedly carried by the free end of an operating lever (50) so that the cam element axis is substantially perpendicular to the axis of the operating lever, the opposing surface sections of said cam element thus being adapted to engage a member 24 forming part of the fixing rack and an opposing end portion of the front panel 38 of the slide-in unit 16 respectively, said member 24 of the fixing rack and said end portion of the front panel 38 defining an interspace 42 therebetween adapted for receiving said cam element, said cam element having an ellipse-shaped transversal cross-section, the major axis of the ellipse forming an angle with the axis of the operating lever, which is larger than the angle formed by the minor axis of the ellipse and the operating lever axis.

15. A tool as claimed in claim 14 characterized in that the minor axis of the ellipse forms an angle with the axis of the operating lever (50) of from 15 to 20 degrees.

16. A tool as claimed in claim 14 characterized in that the operating lever (50) tapers towards the free end (58).

* * * * *